United States Patent
Gross et al.

(10) Patent No.: US 7,248,980 B1
(45) Date of Patent: Jul. 24, 2007

(54) METHOD AND APPARATUS FOR REMOVING QUANTIZATION EFFECTS IN A QUANTIZED SIGNAL

(75) Inventors: Kenny C. Gross, San Diego, CA (US); Ramakrishna C. Dhanekula, San Diego, CA (US); Eugenio J. Schuster, Breinigsville, PA (US); Gregory A. Cumberford, Calgary (CA)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/342,057

(22) Filed: Jan. 27, 2006

(51) Int. Cl.
*H03H 17/02* (2006.01)

(52) U.S. Cl. .................. 702/66; 324/76.38; 702/75; 702/76; 702/77; 702/189; 708/300; 708/321; 708/403

(58) Field of Classification Search ............ 324/76.11, 324/76.12, 76.19, 76.21, 76.22, 76.24, 76.38; 340/500, 540, 679; 700/90, 108; 702/33, 702/66, 75, 76, 77, 189; 708/270, 271, 272, 708/403, 404, 405, 821, 300, 321
See application file for complete search history.

(56) References Cited

U.S. PATENT DOCUMENTS

| | | | | |
|---|---|---|---|---|
| 3,162,808 A | * | 12/1964 | Haase | 324/76.21 |
| 3,488,862 A | * | 1/1970 | Eckhart | 434/188 |
| 4,937,763 A | | 6/1990 | Mott | 364/550 |
| 5,014,229 A | * | 5/1991 | Mofachern | 702/106 |
| 5,250,907 A | * | 10/1993 | Fukui | 324/614 |
| 5,359,663 A | * | 10/1994 | Katz | 381/71.2 |
| 5,574,674 A | * | 11/1996 | Pan | 708/403 |
| 5,917,738 A | * | 6/1999 | Pan | 708/403 |

FOREIGN PATENT DOCUMENTS

| | | | |
|---|---|---|---|
| JP | 02-124622 A | * | 5/1990 |
| WO | WO 95/25382 A1 | * | 9/1995 |

* cited by examiner

*Primary Examiner*—Edward R. Cosimano
(74) *Attorney, Agent, or Firm*—Park, Vaughan & Fleming LLP

(57) ABSTRACT

One embodiment of the present invention provides a system that reconstructs a high-resolution signal from a set of low-resolution quantized samples. During operation, the system receives a time series containing low-resolution quantized signal values which are sampled from the high-resolution signal. Next, the system performs a spectral analysis on the time series to obtain a frequency series for the low-resolution quantized signal values. The system next selects a subset of frequency terms from the frequency series which have the largest amplitudes. The system then reconstructs the high-resolution signal by performing an inverse spectral analysis on the subset of the frequency terms.

23 Claims, 6 Drawing Sheets

METHOD AND APPARATUS FOR REMOVING QUANTIZATION EFFECTS IN A QUANTIZED SIGNAL

BACKGROUND

1. Field of the Invention

The present invention relates to techniques for proactively detecting impending problems in computer systems. More specifically, the present invention relates to a method and an apparatus for removing quantization effects in a quantized signal which can be subsequently used to detect impending problems in a computer system.

2. Related Art

Modern server computer systems are typically equipped with a significant number of sensors which monitor signals during the operation of the computer systems. Results from this monitoring process can be used to generate time series data for these signals which can subsequently be analyzed to determine how a computer system is operating. One particularly desirable application of this time series data is for purposes of "proactive fault monitoring" to identify leading indicators of component or system failures before the failures actually occur.

Unfortunately, many of these computer systems use low-resolution eight-bit analog-to-digital (A/D) converters in all of their physical sensors to sample the signals. This causes readings of physical variables such as voltage, current, and temperature to be highly quantized. Hence, the sampled signal values from these sensors can only assume discrete values, and no readings can be reported between these discrete values. For example, voltages for system board components may be quantized to the nearest 10 mV; e.g. 1.60 V, 1.61 V, 1.62 V, etc. Hence, if the true voltage value is 1.6035 V, it can only be reported as one of the quantized values, 1.60 or 1.61.

Note that the above-described quantization effects present a serious problem for proactive fault monitoring. Normally, one can apply statistical pattern recognition techniques to continuous signal values to detect if the signals start to drift away from steady-state values at a very early stage of system degradation. However, with significant quantization, conventional statistical pattern recognition techniques cannot be used effectively to detect the onset of subtle anomalies that might precede component or system failures.

To overcome the drawbacks of the low-resolution quantized signals, researchers have used a technique called "burst sampling." Essentially, this technique restores high-resolution signals from low-resolution A/D converter outputs by removing the quantization effects. Specifically, a large "burst" of samples (typically hundreds of sample) are retrieved from low-level hardware registers of the server computer system being monitored. These samples are then collected through telemetry channels at the highest data rate that the hardware channels can support (typically at kHz rates). Next, the samples in the "burst" are averaged to obtain values that approximate signals sampled with high-resolution data-acquisition capability.

Unfortunately, this burst sampling technique can be used only for a small subset of signals of interest in a large system. This is because the burst sampling creates a large burst demand for the bandwidth that is available for delivering telemetry samples via the system bus. In some large systems over 1000 telemetry signals are monitored concurrently. However, the burst sampling technique can consume the entire system bus bandwidth while delivering only a few tens of these signals.

What is needed is a method and an apparatus that removes the quantization effects from low-resolution quantized signals without the above-described problems.

SUMMARY

One embodiment of the present invention provides a system that reconstructs a high-resolution signal from a set of low-resolution quantized samples. During operation, the system receives a time series containing low-resolution quantized signal values which are sampled from the high-resolution signal. Next, the system performs a spectral analysis on the time series to obtain a frequency series for the low-resolution quantized signal values. The system next selects a subset of frequency terms from the frequency series which have the largest amplitudes. The system then reconstructs the high-resolution signal by performing an inverse spectral analysis on the subset of the frequency terms.

In a variation on this embodiment, the system selects the subset of the frequency terms by first sorting the frequency terms in the frequency series based on amplitudes of the frequency terms in the frequency series.

In a variation on this embodiment, the spectral analysis is a Discrete Fourier Transform (DFT).

In a variation on this embodiment, the inverse spectral analysis is an inverse Discrete Fourier Transform (IDFT).

In a further variation on this embodiment, the DFT is computed using a Fast Fourier Transform (FFT).

In a variation on this embodiment, the subset of the frequency terms is a predetermined number of frequency terms which have the largest amplitudes from the frequency series.

In a further variation on this embodiment, the system precomputes the predetermined number. During this precomputation process, the system receives a high-resolution signal. Next, the system iteratively: selects the first n frequency terms which have the largest amplitudes from the frequency series; reconstructs a signal by performing an inverse spectral analysis on the selected n frequency terms; and computes a difference between the high-resolution signal and the reconstructed signal. The system then determines the predetermined number by identifying a value of n that gives rise to a minimum difference between the high-resolution signal and the reconstructed signal.

In a further variation on this embodiment, the system computes the difference between the high-resolution signal and the reconstructed signal by computing a residual signal which is obtained by subtracting the reconstructed signal from the high-resolution signal.

In a further variation on this embodiment, the amplitudes of the frequency series are determined by a power spectral density (PSD) of the frequency series.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, magnetic and optical storage devices such as disk drives, magnetic tape, CDs (compact discs) and DVDs (digital versatile discs or digital video discs).

Quantization Effect

Figure 1:
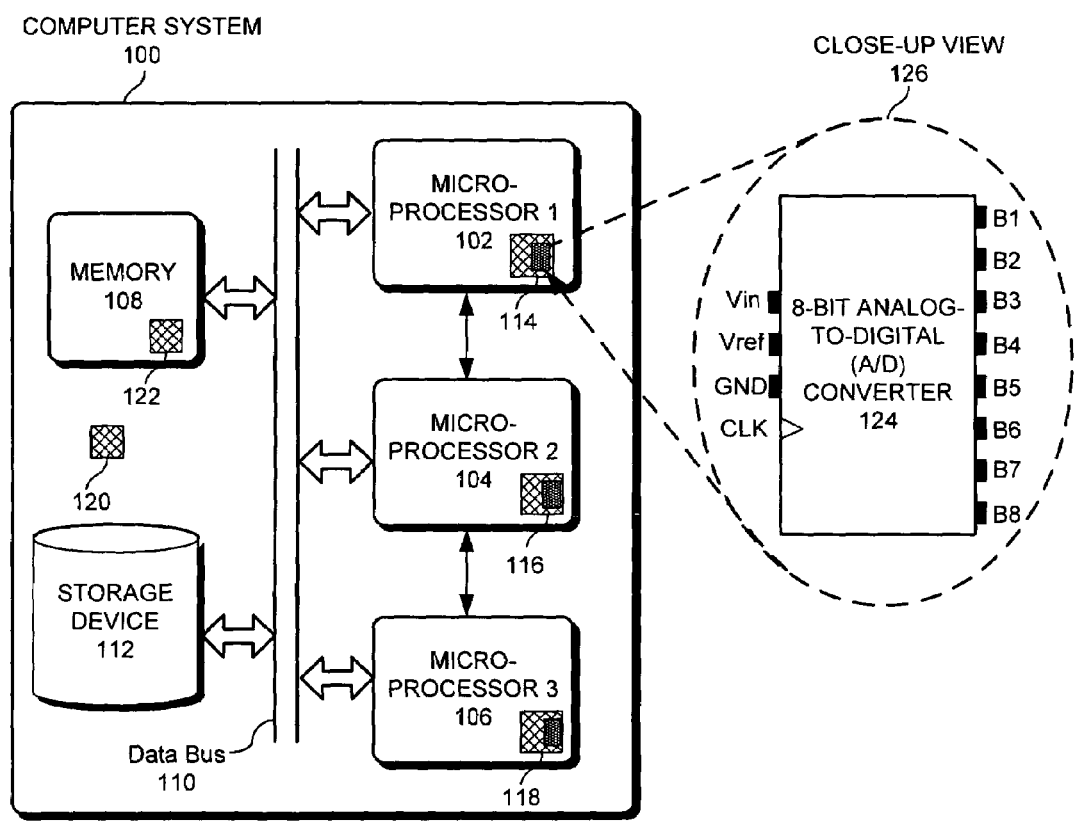
FIG. 1 illustrates a computer system with sensors that detect signals in different parts of the computer system in accordance with an embodiment of the present invention.

FIG. 1 illustrates a computer system 100 with sensors that monitor signals in different parts of the computer system in accordance with an embodiment of the present invention.

Computer system 100 comprises multiple processors 102, 104, and 106. Processors 102, 104, and 106 communicate with memory 108 through data bus 110. Memory 108 can include any type of memory that can store code and data for execution by the processors 102, 104, and 106. This includes, but is not limited to, static random access memory (SRAM), dynamic RAM (DRAM), magnetic RAM (MRAM), non-volatile RAM (NVRAM), flash memory, and read only memory (ROM).

Processors 102, 104, and 106 communicate with storage device 112 through data bus 110. Storage device 112 can include any type of non-volatile storage device that can be coupled to a computer system. This includes, but is not limited to, magnetic, optical, and magneto-optical storage devices, as well as storage devices based on flash memory and/or battery-backed up memory.

Processors 102, 104, and 106 can include any type of processor, including, but not limited to, a microprocessor, a mainframe computer, a digital signal processor, a personal organizer, a device controller and a computational engine within an appliance.

In order to monitor a signal associated with the operation of computing system 100, several sensors 114, 116, 118, 120, and 122 can be selectively positioned throughout the computing system 100. These sensors (114, 116, 118, 120, and 122) monitor signals, such as voltage, current, and temperature, within specific components in the computer system. For example, sensor 122 can be used to monitor a particular voltage provided to a bank of storage cells (not shown) in memory 108.

In one embodiment, physical sensors 114, 116, and 118 which reside within processors 102, 104, and 106, respectively, are used to detect and identify a drift in core voltage "vCore" of the processors. Each sensor 114, 116 and 118 includes an analog-to-digital (A/D) converter 124, which is shown inside close-up view 126. A/D converter 124 converts a continuous analog signal into a series of discrete, digital values. For example, A/D converter 124 converts the analog vCore signal of processor 102 into a digital format which can be monitored and manipulated by processor 102.

Furthermore, A/D converter 124 shown in FIG. 1 is an eight-bit A/D converter, which means that the digital output generated by A/D converter 124 is represented using an eight-bit value. Specifically, it samples the analog signal at pin $V_{in}$ at a rate determined by clock signal CLK, and produces an eight-bit digital output on pins B1 to B8. Note that A/D converter 124 can generate $2^8$, or 256 discrete values. In comparison, an A/D converter with a 4-bit data output can produce $2^4$, or 16 discrete values. Similarly, a 10-bit A/D converter can produce $2^{10}$, or 1024 discrete values.

The process of representing a continuous, analog signal with discrete values is known as "quantization." For example, the eight-bit A/D converter output representing a vCore signal can be rounded to the nearest 10 mV, with quantized values of 1.60 V, 1.61 V, 1.62 V, 1.63 V, etc. Hence, an analog voltage of 1.614V can be represented by the eight-bit A/D converter as either 1.61 V or 1.62V. The distance between the adjacent quantized values is referred to as a "quantization resolution", which is 10 mV in this example. The larger this difference is, the lower the quantization resolution. Note that a low quantization resolution can make it difficult to detect subtle changes which are fractions of the quantization resolution before a significant drift has taken place.

Process for Reconstructing a High-Resolution Signal

Figure 2:
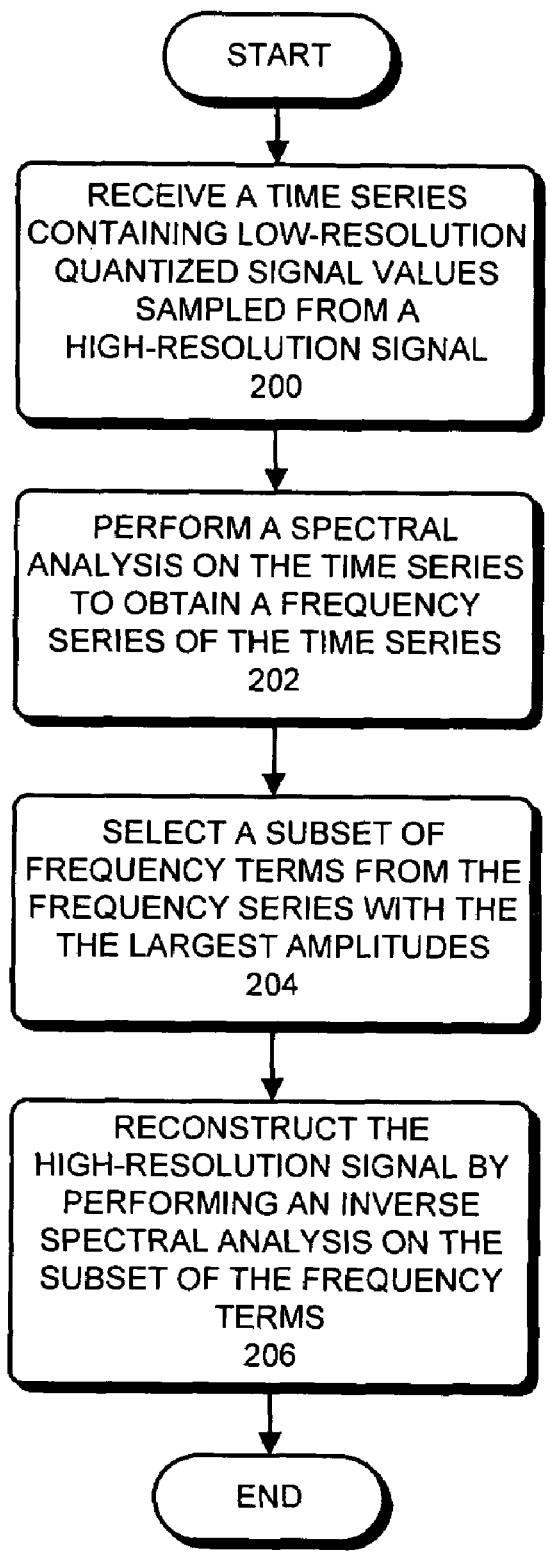
FIG. 2 presents a flowchart illustrating a process of reconstructing a high-resolution signal from a set of low-resolution quantized samples in a computer system in accordance with an embodiment of the present invention.

FIG. 2 presents a flowchart illustrating a process of reconstructing a high-resolution signal from a set of low-resolution quantized samples in a computer system in accordance with an embodiment of the present invention.

The process typically begins by receiving a time series containing the low-resolution quantized signal values which are sampled from the high-resolution continuous-time signal (step 200). In one embodiment of the present invent, the low-resolution quantized signal values are sampled from the high-resolution signal at a constant time interval St over a specific time duration T, wherein the resolution of the quantized signal values is determined by the number of available bits associated with an A/D converter used for the quantization. The quantized signal values over the time duration T are then used to construct the time series.

Next, the process performs a spectral analysis on the time series to obtain a frequency series for the low-resolution quantized signal values in the frequency domain (step 202). In one embodiment of the present invent, the spectral analysis is a Discrete Fourier Transform (DFT), the DFT is computed using a Fast Fourier Transform (FFT) technique.

For example, the process performs the frequency domain transformation on a quantized time series $X_t$ by first performing a conventional Fourier series expansion on $X_t$ so that:

$$X_t = \frac{a_0}{2} + \sum_{m=1}^{N/2} [a_m\cos(\omega_m t) + b_m(\omega_m t)], \quad (1)$$

where $a_0/2$ is the mean value of the quantized signal $X_t$, $a_m$ and $b_m$ are the Fourier coefficients corresponding to the Fourier frequency $\omega_m = 2\pi \times m/N$, and N is the total number of observations in the time series $X_t$.

Let $x_j$ be the value of $X_t$ at the jth time increment, the approximation to the Fourier transform yields:

$$a_m = \frac{2}{N}\sum_{j=0}^{N-1} x_j\cos(\omega_m j) \text{ and } b_m = \frac{2}{N}\sum_{j=0}^{N-1} x_j\sin(\omega_m j) \quad (2)$$

for $0 < m < N/2$.

Accordingly, the Power Spectral Density (PSD) function for the approximated Fourier frequency series can be computed as:

$$I_m = N\frac{a_m^2 + b_m^2}{2}. \quad (3)$$

Note that when there are N observations in the original time series, the resulting PSD function $I_m$ comprises (N/2)+1 harmonics (spectral amplitudes) in the frequency domain.

The process next selects a subset of frequency terms from the frequency series which have the largest amplitudes, i.e., the M highest harmonics, wherein M<N/2+1 (step 204). More specifically, the process selects the subset of the frequency terms by first sorting frequency terms in the frequency series based on amplitudes of the frequency terms in the frequency series, and then selecting the M frequency terms with the highest amplitudes. In one embodiment of the present invention, the amplitudes of the frequency terms are obtained from the PSD function of the frequency series. For example, the amplitude of the frequency term $\omega_m$ can be computed using equation (3).

The process then reconstructs the high-resolution signal by performing an inverse spectral analysis on the subset of the frequency terms (step 206). In one embodiment of the present invent, the inverse spectral analysis is an Inverse Discrete Fourier Transform (IDFT), wherein the IDFT is computed using an Inverse Fast Fourier Transform (IFFT).

Process for Computing a Precomputed Number

In one embodiment of the present invention, the process determines the number of terms in the selected subset of the frequency terms in step 204 based on a precomputed number.

Figure 3:
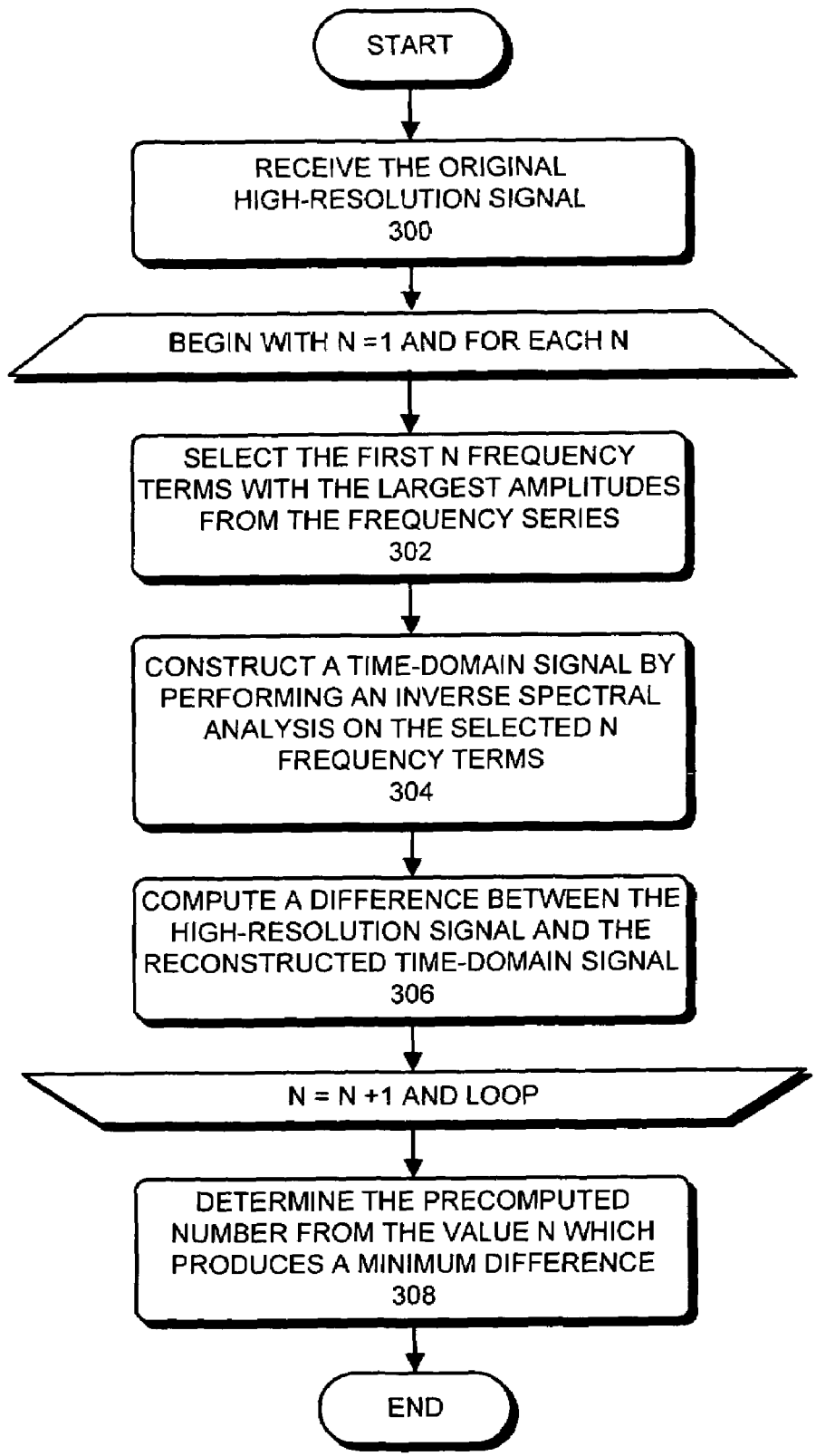
FIG. 3 presents a flowchart illustrating a process of precomputing the number for the selected subset of the frequency terms in accordance with an embodiment of the present invention.

FIG. 3 presents a flowchart illustrating a process of precomputing the number for the selected subset of the frequency terms in accordance with an embodiment of the present invention.

The process first receives the original continuous-time high-resolution analog signal from which the low-resolution signal is obtained (step 300).

Next, the process iteratively selects the first n frequency terms which have the largest amplitudes from the frequency series of the low-resolution signal (step 302). Note that the system can begin with n=1, and can increment n by 1 for each new iteration.

For each iteration of n, the process then reconstructs a time-domain signal by performing an inverse spectral analysis on the selected n frequency terms (step 304). In one embodiment of the present invent, the inverse spectral analysis is an inverse Discrete Fourier Transform (IDFT), wherein the IDFT is computed using an inverse Fast Fourier Transform (IFFT).

The process next computes the difference between the high-resolution signal and the reconstructed signal (step 306). Specifically, the process computes the difference between the high-resolution signal and the reconstructed signal by computing a residual signal. In one embodiment of the present invention, the residual signal is obtained by subtracting the reconstructed signal from the high-resolution signal.

Next, the process determines the precomputed number by identifying a value of n that gives rise to the minimum difference between the high-resolution signal and the reconstructed signal (step 308). In one embodiment of the present invention, the difference between the two signals is determined by computing the sum-of-squares (SS) of the residual signal computed in step 306.

EXAMPLE

The following example demonstrates the process of reconstructing a high-resolution signal from a set of low-resolution quantized samples using a Fourier spectral analysis technique. The original high-resolution signal is a continuous-time voltage signal monitored in a server computing system, wherein the high-resolution signal has been recorded for comparison purpose. The set of low-resolution samples is a discrete-time quantized signal which is sampled as a time series from the high-resolution signal. The quantized signal is then decomposed into a frequency series by applying the spectral analysis. Next, the frequency series are sorted in order of the amplitudes of the harmonics.

Figure 4:
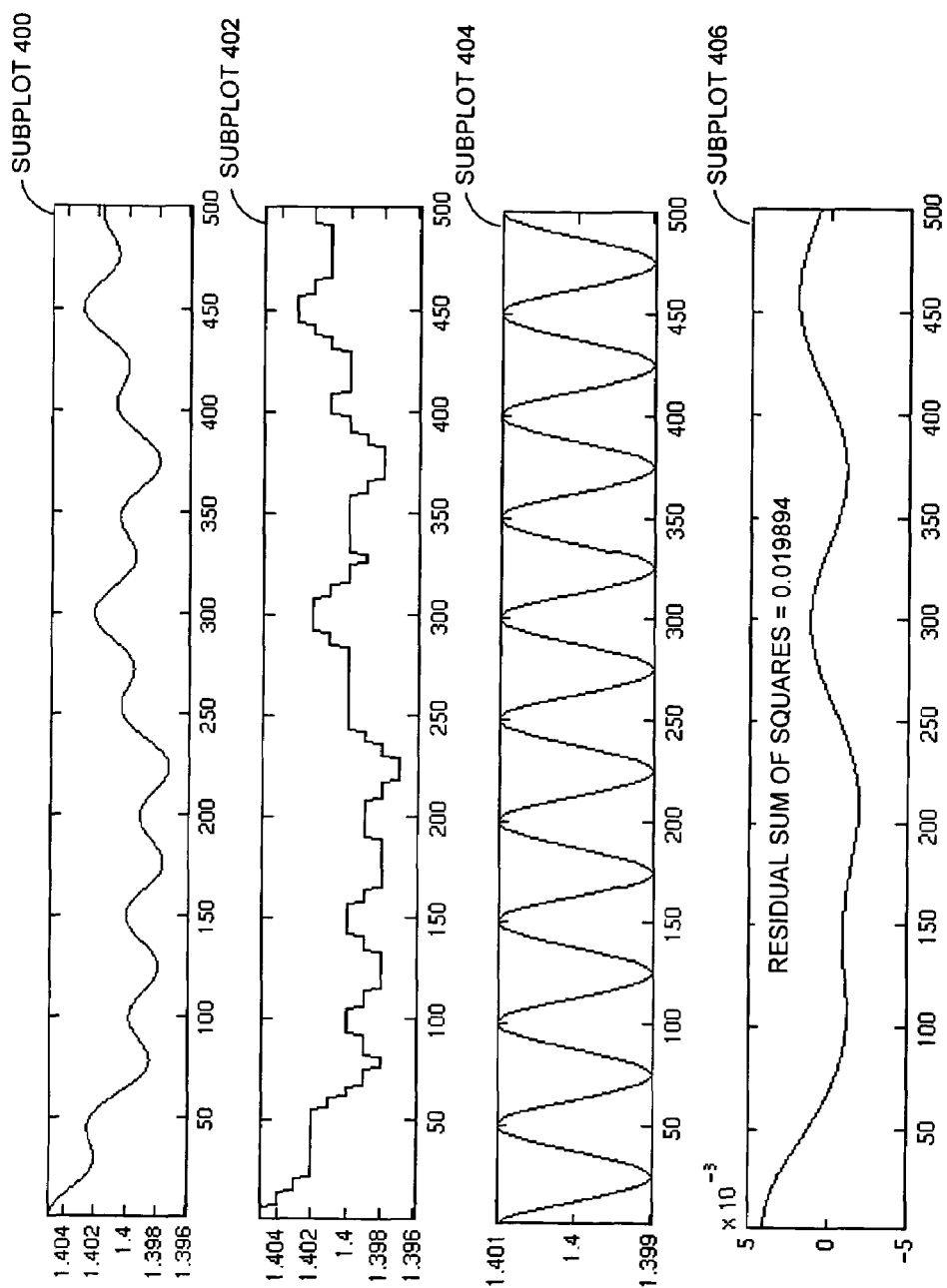
FIG. 4 illustrates the process of reconstructing the high-resolution voltage signal by using only two highest harmonics of the frequency terms in accordance with an embodiment of the present invention.

FIG. 4 illustrates the process of reconstructing the high-resolution voltage signal by using only two highest harmonics of the frequency terms in accordance with an embodiment of the present invention. Note that there are four subplots in FIG. 4. Subplot 400 is the original high-resolution voltage signal. Subplot 402 shows the corresponding quantized signal after sampling with a low-resolution eight-bit A/D converter chip. Note that the quantized signal is a time series comprising about 500 samples.

Next, if one performs a frequency-domain Fourier transformation of the quantized signal 402 and then selects only the two highest harmonics in amplitudes from the frequency series (M=2), the reconstructed time-domain signal is shown in subplot 404 of FIG. 4. Note that reconstructed signal 404 is very different from the original signal 400. The difference between reconstructed signal 404 (also referred to as a "synthesized signal") and the high-resolution signal 400 is referred to as a "residual", which is plotted in subplot 406 on the bottom of FIG. 4. The Sum-of-Squares (SS) of the residual is used to measure how large the residual is. For M=2 the residuals SS is about 0.0199, which are relatively large.

Figure 5:
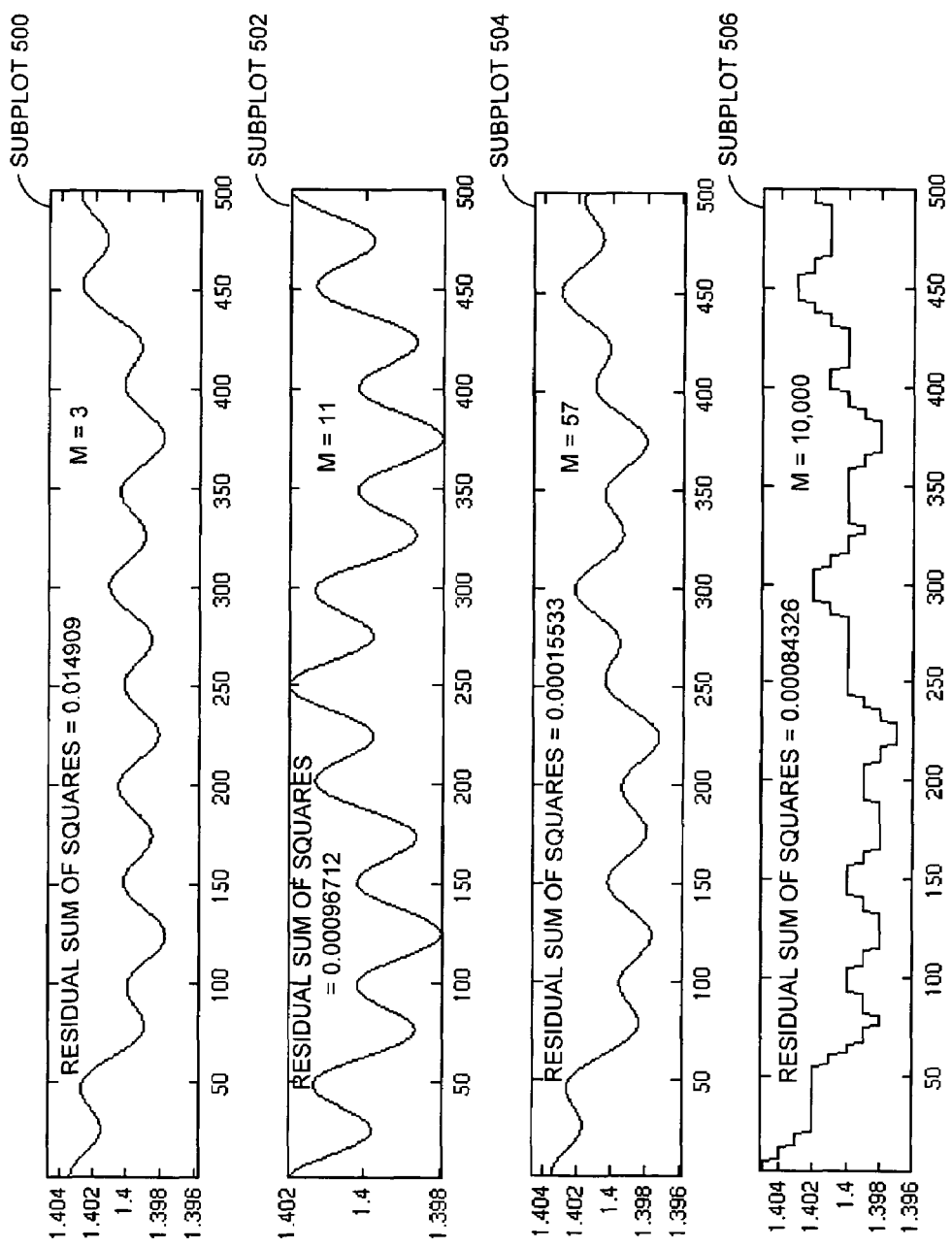
FIG. 5 illustrates the process of reconstructing the high-resolution signal by using different number of the highest harmonics of the frequency series in accordance with an embodiment of the present invention.

FIG. 5 illustrates the process of reconstructing the high-resolution signal by using different number of the highest harmonics of the frequency series in accordance with an embodiment of the present invention. Subplots 500, 502, 504 and 506 in FIG. 5 represent the reconstructed the high-resolution signal using M=3, 11, 57, and 10,000 highest harmonics of the frequency series, respectively.

Note that when M=3, synthesized signal 500 is slightly closer to the high-resolution signal than synthesized signal 404 for M=2, which is also measured as a decrease of the residual SS from 0.0199 to 0.0149. As more harmonics are added while reconstructing the high-resolution signal, the synthesized signal begins to look increasingly closer to the original high-resolution signal, while the residual SS continues to decrease. For example, subplot 502 shows the synthesized signal for M=11, and the residual SS which has dropped to about 0.00097.

Even though the residual SS initially decreases with an increasing M value, note that when M becomes too large, the synthesized signal approaches the quantized signal 402, which is undesirable. This means that for sufficiently large M values, the residual SS increases again. Hence, there exists an M value which achieves a minimum residual SS while generating a synthesized signal that near-perfectly reconstructs the high-resolution signal.

Figure 6:
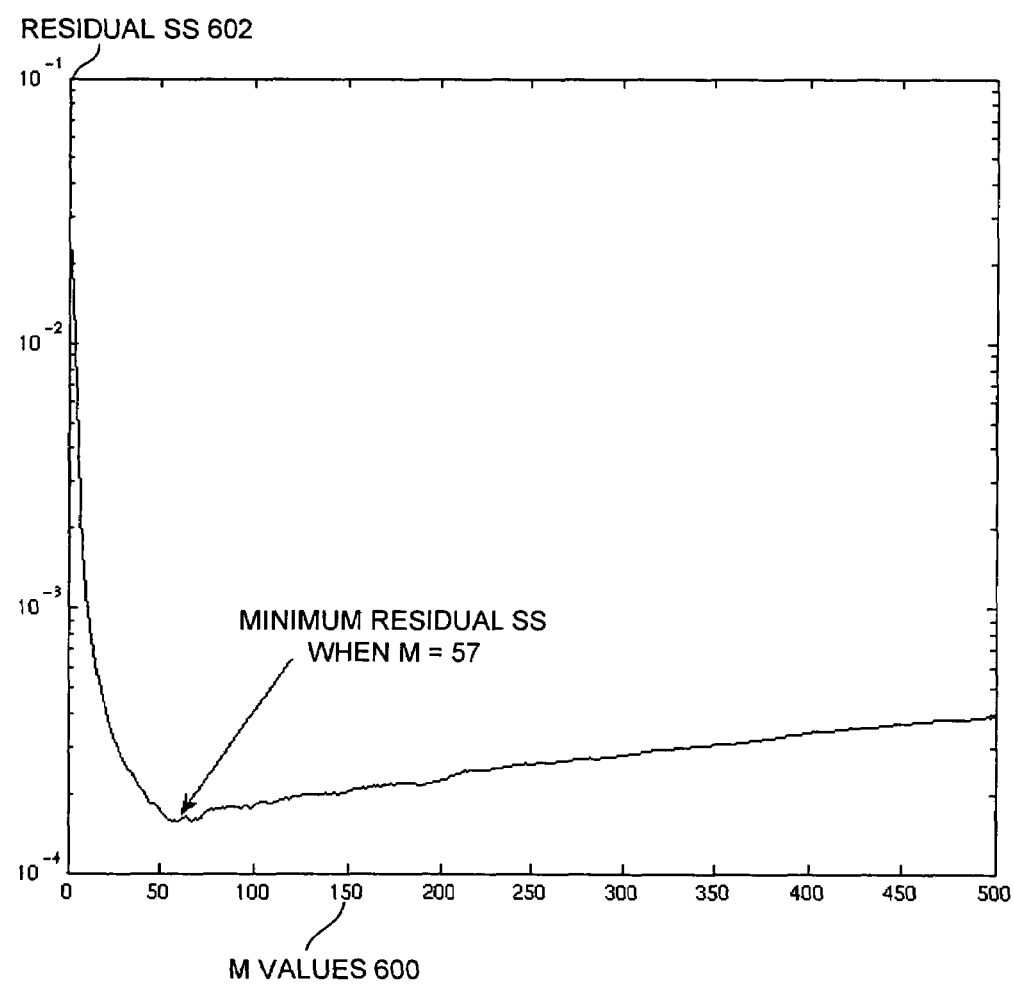
FIG. 6 illustrates a process of searching for a value M that achieves a minimum residual sum-of-squares in an associated synthesized signal in accordance with an embodiment of the present invention.

FIG. 6 illustrates a process of searching for a value M that achieves a minimum residual SS in an associated synthesized signal in accordance with an embodiment of the present invention. The horizontal axis of FIG. 6 shows the M values (600) used in the reconstruction, and the vertical axis of FIG. 6 shows the corresponding residual SS (602) for each M value. Using a simple gradient descent method, one can determine that in this example, the lowest residual SS is obtained for M=57.

Referring back to subplot 504 in FIG. 5 which corresponds to M=57, note that when the optimal value of M=57 is used in the reconstruction process, the difference between the synthesized signal 504 and the original high-resolution signal 400 is very small, as predicted in FIG. 6. This is also indicated by a residual SS value of only 0.00016.

As mentioned previously, when M value continues to increase towards a very large number, the synthesized signal asymptotically approaches the low-resolution quantized signal 402. This effect is demonstrated in subplot 504 in FIG. 5 for M=10,000, wherein the signal waveform is a perfect copy of the one in subplot 402.

Note that it is desirable to pick a relatively small value for M for computational efficiency. FIG. 6 shows that one can pick an M value anywhere between 40 and 100 and still attain an excellent accuracy in the synthesis of the original high-resolution signal. Hence, in the process of reconstruction, one can choose an M value over a broad range, preferably smaller than the optimized M value that achieves a minimum Residual SS, thereby saving computational time.

Note that the spectral synthesis technique introduced herein consumes only a small fraction of the bandwidth on the system bus. Hence, it can be applied concurrently to a large number of physical telemetry signals being monitored within a large system, thereby removing quantization effects in the low-resolution telemetry signals and obtaining high-resolution signals. The reconstructed high-resolution signals can then be used to detect problems in these signals by applying the conventional statistical pattern recognition techniques.

Also note that the spectral synthesis technique introduced herein is a "preprocessing" approach which is designed to "undo" the quantization effects at the source of the signals. In one embodiment of the present invention, the technique is performed on the same system that is being monitored.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for removing quantization effects from a set of low-resolution quantized samples, the method comprising:
   receiving a time series containing a low-resolution quantized signal which is sampled from a high-resolution signal;
   performing a spectral analysis on the time series to obtain a frequency series for the low-resolution quantized signal;
   selecting a subset of frequency terms from the frequency series which have the largest amplitudes; and
   reconstructing the high-resolution signal from the low-resolution quantized signal by performing an inverse spectral analysis on the subset of the frequency terms,
   wherein reconstructing the high-resolution signal facilitates removing the quantization effects from the low-resolution quantized signal.

2. The method of claim 1, wherein the inverse spectral analysis is an inverse Discrete Fourier Transform (IDFT).

3. The method of claim 1, wherein selecting the subset of the frequency terms involves first sorting the frequency terms in the frequency series based on amplitudes of the frequency terms in the frequency series.

4. The method of claim 3, wherein the amplitudes of the frequency series are determined by a power spectral density (PSD) of the frequency series.

5. The method of claim 1, wherein the spectral analysis is a Discrete Fourier Transform (DFT).

6. The method of claim 5, wherein the DFT is computed using a Fast Fourier Transform (FFT).

7. The method of claim 1, wherein the subset of the frequency terms is a predetermined number of frequency terms which have the largest amplitudes from the frequency series.

8. The method of claim 7, wherein the predetermined number is determined by:
   identifying a value n that gives rise to a minimum difference between the high-resolution signal and a reconstructed signal by iteratively,
      selecting the first n frequency terms which have the largest amplitudes from the frequency series;
      reconstructing a signal by performing an inverse spectral analysis on the selected n frequency terms; and
      computing a difference between the high-resolution signal and the reconstructed signal.

9. The method of claim 8, wherein computing the difference between the high-resolution signal and the reconstructed signal involves computing a residual signal by subtracting the reconstructed signal from the high-resolution signal.

10. A computer-readable storage medium storing instructions that when executed by a computer cause the computer to perform a method for removing quantization effects from a set of low-resolution quantized samples, the method comprising:
   receiving a time series containing a low-resolution quantized signal which is sampled from a high-resolution signal;

performing a spectral analysis on the time series to obtain a frequency series for the low-resolution quantized signal;

selecting a subset of frequency terms from the frequency series which have the largest amplitudes; and reconstructing the high-resolution signal from the low-resolution quantized signal by performing an inverse spectral analysis on the subset of the frequency terms, wherein reconstructing the high-resolution signal facilitates removing the quantization effects from the low-resolution quantized signal.

11. The computer-readable storage medium of claim 10, wherein the inverse spectral analysis is an inverse Discrete Fourier Transform (IDFT).

12. The computer-readable storage medium of claim 10, wherein selecting the subset of the frequency terms involves first sorting the frequency terms in the frequency series based on amplitudes of the frequency terms in the frequency series.

13. The computer-readable storage medium of claim 12, wherein the amplitudes of the frequency series are determined by a power spectral density (PSD) of the frequency series.

14. The computer-readable storage medium of claim 10, wherein the spectral analysis is a Discrete Fourier Transform (DFT).

15. The computer-readable storage medium of claim 14, wherein the DFT is computed using a Fast Fourier Transform (FFT).

16. The computer-readable storage medium of claim 10, wherein the subset of the frequency terms is a predetermined number of frequency terms which have the largest amplitudes from the frequency series.

17. The computer-readable storage medium of claim 16, wherein the predetermined number is determined by:

identifying a value n that gives rise to a minimum difference between the high-resolution signal and a reconstructed signal by iteratively, selecting the first n frequency terms which have the largest amplitudes from the frequency series;

reconstructing a signal by performing an inverse spectral analysis on the selected n frequency terms; and computing a difference between the high-resolution signal and the reconstructed signal.

18. The computer-readable storage medium of claim 17, wherein computing the difference between the high-resolution signal and the reconstructed signal involves computing a residual signal by subtracting the reconstructed signal from the high-resolution signal.

19. An apparatus for removing quantization effects from a set of low-resolution quantized samples, comprising:

a receiving mechanism configured to receive a time series containing a low-resolution quantized signal which is sampled from a high-resolution signal;

a performing mechanism configured to perform a spectral analysis on the time series to obtain a frequency series for the low-resolution quantized signal;

a selection mechanism configured to select a subset of frequency terms from the frequency series which have the largest amplitudes; and a reconstruction mechanism configured to reconstruct the high-resolution signal from the low-resolution quantized signal by performing an inverse spectral analysis on the subset of the frequency terms, wherein reconstructing the high-resolution signal facilitates removing the quantization effects from the low-resolution quantized signal.

20. The apparatus of claim 19, wherein selecting the subset of frequency terms involves a sorting mechanism configured to sort the frequency terms in the frequency series based on amplitudes of the frequency terms in the frequency series.

21. The apparatus of claim 19, wherein the subset of the frequency terms is a predetermined number of frequency terms which have the largest amplitudes from the frequency series.

22. The apparatus of claim 21, wherein the apparatus comprises a determination mechanism which is configured to determine the predetermined number by:

identifying a value n that gives rise to a minimum difference between the high-resolution signal and a reconstructed signal by iteratively, selecting the first n frequency terms which have the largest amplitudes from the frequency series;

reconstructing a signal by performing an inverse spectral analysis on the selected n frequency terms; and computing a difference between the high-resolution signal and the reconstructed signal.

23. The apparatus of claim 22, wherein computing the difference between the high-resolution signal and the reconstructed signal involves a computation mechanism configured to compute a residual signal by subtracting the reconstructed signal from the high-resolution signal.

* * * * *